(12) United States Patent
Hua et al.

(10) Patent No.: US 7,140,512 B2
(45) Date of Patent: Nov. 28, 2006

(54) INTERLOCKING LID FOR WET BENCH

(75) Inventors: Yuen-Sheng Hua, Ping-Tung (TW);
Chi-Shen Yang, Hsinchu County (TW);
Yuan-Bang Lee, Tongsiao Township, Miaoli County (TW); Ming-Zhe Chiang, Hsinchu (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 165 days.

(21) Appl. No.: 10/761,628

(22) Filed: Jan. 20, 2004

(65) Prior Publication Data

US 2005/0155976 A1    Jul. 21, 2005

(51) Int. Cl.
*B65D 51/04*    (2006.01)
(52) U.S. Cl. .................................. 220/826; 134/155
(58) Field of Classification Search ............ 220/826, 220/219, 259.2; 206/710; 475/744.1, 744.5; 134/155, 186
See application file for complete search history.

(56) References Cited

U.S. PATENT DOCUMENTS

| | | | | |
|---|---|---|---|---|
| 5,975,345 | A * | 11/1999 | Taylor | 220/826 |
| 6,196,470 | B1 * | 3/2001 | Neumann | 238/8 |
| 6,644,526 | B1 * | 11/2003 | Pegorier | 224/539 |
| 6,692,352 | B1 * | 2/2004 | Gerber et al. | 460/119 |
| 6,926,137 | B1 * | 8/2005 | Rudnick et al. | 206/15.3 |

* cited by examiner

*Primary Examiner*—Lien M. Ngo
(74) *Attorney, Agent, or Firm*—Tung & Associates

(57) ABSTRACT

An interlocking lid which is suitable for a wet bench tank used in the processing of semiconductor wafer substrates. The interlocking lid includes a pair of lid panels typically provided with a clasp having elements for engaging and interlocking with each other when the lid panels are in a closed position. At least one of the lids may further include a beveled lid shoulder which facilitates runoff of liquids from and hinders pooling of liquids on the exterior surface of the lid.

16 Claims, 3 Drawing Sheets

INTERLOCKING LID FOR WET BENCH

FIELD OF THE INVENTION

The present invention relates to processes and equipment for removing potential circuit-contaminating particles from WIP (work-in-process) semiconductor wafers in the semiconductor fabrication industry. More particularly, the present invention relates to a novel interlocking lid having a pair of interlocking lid panels for a wet bench, at least one of which lid panels has a bevel-shaped exterior flow surface to facilitate the sweeping of residual cleaning fluid therefrom during opening of the panels.

BACKGROUND OF THE INVENTION

Generally, the process for manufacturing integrated circuits on a silicon wafer substrate typically involves deposition of a thin dielectric or conductive film on the wafer using oxidation or any of a variety of chemical vapor deposition processes; formation of a circuit pattern on a layer of photoresist material by photolithography; placing a photoresist mask layer corresponding to the circuit pattern on the wafer; etching of the circuit pattern in the conductive layer on the wafer; and stripping of the photoresist mask layer from the wafer. Each of these steps, particularly the photoresist stripping step, provides abundant opportunity for organic, metal and other potential circuit-contaminating particles to accumulate on the wafer surface.

In the semiconductor fabrication industry, minimization of particle contamination on semiconductor wafers increases in importance as the integrated circuit devices on the wafers decrease in size. With the reduced size of the devices, a contaminant having a particular size occupies a relatively larger percentage of the available space for circuit elements on the wafer as compared to wafers containing the larger devices of the past. Moreover, the presence of particles in the integrated circuits compromises the functional integrity of the devices in the finished electronic product.

Currently, mini-environment based IC manufacturing facilities are equipped to control airborne particles much smaller than 1.0 μm, as surface contamination continues to be of high priority to semiconductor manufacturers. To achieve an ultraclean wafer surface, particles must be removed from the wafer, and particle-removing methods are therefore of utmost importance in the fabrication of semiconductors.

The most common system for cleaning semiconductor wafers during wafer processing includes a series of tanks which contain the necessary cleaning solutions and are positioned in a "wet bench" in a clean room. Batches of wafers are moved in sequence through the tanks, typically by operation of a computer-controlled automated apparatus. Currently, semiconductor manufacturers use wet cleaning processes which may use cleaning agents such as deionized water and/or surfactants.

Other wafer-cleaning processes utilize solvents, dry cleaning using high-velocity gas jets, and a megasonic cleaning process, in which very high-frequency sound waves are used to dislodge particles from the wafer surface. Cleaning systems which use deionized (DI) water currently are widely used in the industry because the systems are effective in removing particles from the wafers and are relatively cost-efficient. Approximately 4.5 tons of water are used for the production of each 200-mm, 16-Mbit, DRAM wafer.

A conventional wet bench system 8 is shown schematically in FIG. 1. The system 8 includes wet bench tanks 10a, 10b, 10c. The first tank 10a and second tank 10b each typically contains a basic ACT organic solvent solution (not shown) in which multiple wafers 16 are immersed for the stripping of photoresist from each of the wafers 16. In the third wet bench tank 10c, the wafers 16 are typically rinsed with an aqueous acidic NOE solution, which removes photoresist residues and particles from the wafers 16 after the wafers 16 are immersed in the basic ACT solutions in the first tank 10a and second tank 10b, for example. Typical other uses for the system 8 include SPM cleaning, APM cleaning and M2 etch/cleaning, for example.

Each tank 10a, 10b, 10c includes tank walls 12 that define a tank interior 14 which receives the multiple wafers 16. As shown in FIG. 2, the first tank 10a, as well as the second tank 10b and third tank 10c, typically includes a top opening 15 which is reversibly closed by a pair of half-lid panels 18 hingedly attached to respective opposing tank walls 12. When closed, the half-lid panels 18 are separated by a lid gap 20. In another design, shown in FIG. 3, each wet bench cleaning tank 22 includes a full-lid panel 24 which is hingedly attached to one of the tank walls 12 to reversibly close the top opening 15.

In operation of the system 8, a wafer boat or other wafer support (not illustrated), which typically holds up to fifty of the semiconductor wafers 16 in horizontally-adjacent relationship to each other, is sequentially placed in the tank interiors 14 of the wet bench tanks 10a, 10b, 10c, respectively. The wafers 16 are initially immersed in the basic first ACT solution (not shown) contained in the first tank 10a for the stripping of photoresist from the wafers 16 after a photolithography process is carried out on the wafers 16.

Next, a wafer transfer robot 26 transfers the wafers 16 from the first tank 10a to the second tank 10b. In the second tank 10b, the wafers 16 are immersed in a second ACT solution, which removes residual photoresist from the wafers 16. Finally, the robot 26 transfers the wafers 16 from the second tank 10b to the third tank 10c, where the wafers 16 are rinsed with the acidic NOE solution, which removes additional residual particles from the wafers 16 prior to further processing.

After the wafers 16 are placed in the third tank 10c, the robot 26 typically returns to the load position adjacent to the first tank 10a to receive an additional lot of wafers and place the wafers in the first tank 10a. However, during transit of the robot 26, residual aqueous acid solution 28 which remains on the robot 26 has a tendency to drip from the robot 26 and fall into the ACT solution in the first tank 10a and second tank 10b, through the lid gap 20. Some of the residual aqueous acid solution 28 drips onto the half-lid panels 18 and flows into the tank 10a or 10b through the lid gap 20.

While the NOE solution used to rinse the wafers in the third tank 10c typically contains about 5% water, the ACT organic solvents in the first tank 10a and second tank 10b typically contain monoethanolamine ($C_2OHNH_2$), without water. In the event that residual aqueous acid NOE solution 28 falls into the ACT organic solvent, the amino group on the monoethanolamine reacts with the water in the NOE solution to form hydroxide ion, according to the following equation:

$$R-NH_2 + H_2O \longrightarrow OH^- + R-NH_3^+$$

The resulting hydroxide ion reacts with and damages aluminum layers and interconnects previously fabricated on the wafers 16. In severe cases, aluminum damage is manifested by peeling of the aluminum layers or interconnects from the wafer 16. Accordingly, a novel interlocking lid for a wet bench is needed to prevent aqueous acid solution from inadvertently dripping from a transfer robot into a basic ACT solution used in the stripping of photoresist from wafers.

Accordingly, an object of the present invention is to provide a novel interlocking lid which is suitable for a wet bench tank.

Another object of the present invention is to provide a novel interlocking lid which substantially prevents a liquid from inadvertently falling into a wet bench tank.

Still another object of the present invention is to provide an interlocking lid which substantially prevents contamination of a liquid in a wet bench tank.

Yet another object of the present invention is to provide a novel interlocking lid which may prevent water-induced damage to metal structures on semiconductor wafers processed in a wet bench tank.

A still further object of the present invention is to provide a novel interlocking lid suitable for a wet bench tank, which interlocking lid may include features that facilitate runoff and prevent or hinder pooling of liquids that fall on the exterior of the lid.

Yet another object of the present invention is to provide a novel interlocking lid which may include a pair of lid panels provided with a clasp for interlocking each other when in a closed position on a wet bench tank.

SUMMARY OF THE INVENTION

In accordance with these and other objects and advantages, the present invention generally relates to a novel interlocking lid which is suitable for a wet bench tank used in the processing of semiconductor wafer substrates. The interlocking lid includes a pair of lid panels typically provided with a clasp having elements for engaging and interlocking with each other when the lid panels are in a closed position. At least one of the lid panels may further include features which facilitate runoff of liquids from and hinder pooling of liquids on the exterior surface of the lid.

In a typical embodiment, the interlocking lid of the present invention includes a base lid panel and a cover lid panel which are hingedly attached to opposite side panels of the wet bench tank. The adjacent inner edges of the base lid panel and cover lid panel, respectively, are shaped to define clasp members which removably engage each other to seal the interior of the wet bench tank. Accordingly, the clasp members provide a seal between the base lid panel and the cover lid panel to prevent the inadvertent flow or dripping of water or other liquid into the wet bench tank between the base lid panel and cover lid panel.

At least one of the base lid panel and cover lid panel may be provided with a feature or features which facilitate the runoff and prevent the pooling or accumulation of water or other liquids on the exterior of the lid panel. One of the features may include a beveled lid shoulder which is shaped in the exterior surface of the lid panel and extends from the front end to the rear end of the panel. The lid shoulder has a beveled configuration which defines a slanted runoff surface when the lid panel is in the open position. This facilitates the runoff of liquids from the exterior surface of the lid upon opening of the lid panel.

A shoulder slope may be provided in one end of the beveled lid shoulder to further facilitate or expedite runoff of liquids from the exterior surface of the lid panel as the lid panel is raised from the closed to the open configuration. The shoulder slope is typically provided in the discharge end of the beveled lid shoulder. The beveled lid shoulder and shoulder slope, in combination with the clasp on the base lid panel and cover lid panel, ensure that water or other liquids pooled on the exterior surface of the lid panel are substantially incapable of inadvertently falling into the wet bench tank to contaminate or react with processing liquids therein.

BRIEF DESCRIPTION OF THE DRAWINGS

The invention will now be described, by way of example, with reference to the accompanying drawings, in which.

DETAILED DESCRIPTION OF THE INVENTION

The present invention has particularly beneficial utility in the sealing of a wet bench tank to prevent the inadvertent contamination of a processing liquid, such as an ACT photoresist stripping solution, in the tank during a PRS (photoresist stripping) process in the fabrication of integrated circuits on semiconductor wafer substrates. However, the invention is not so limited in application, and while references may be made to such wet bench tank, the present invention is more generally applicable to preventing or minimizing liquid or other contamination of tanks in other semiconductor processes as well as other industrial applications outside semiconductor fabrication.

Figure 1:
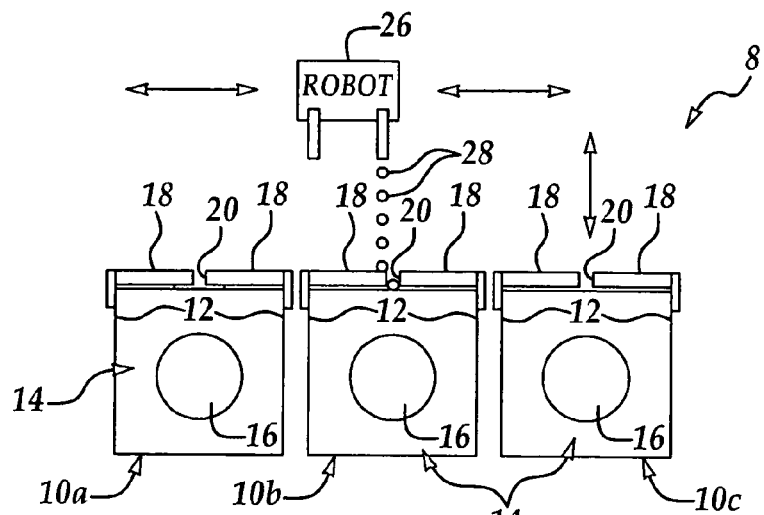
FIG. 1 is a schematic of a typical conventional wet bench system for the sequential processing of semiconductor wafers in multiple wet bench tanks.
Figure 2:
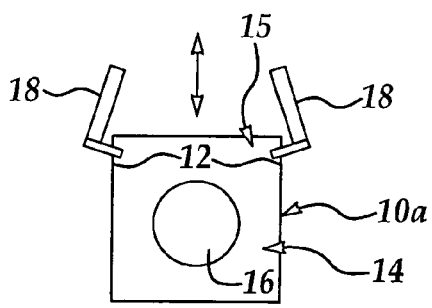
FIG. 2 is a schematic of a conventional wet bench tank having a pair of half-lid panels.
Figure 3:
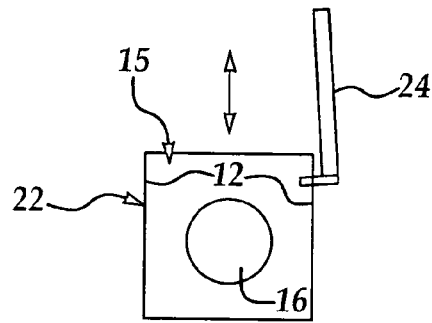
FIG. 3 is a schematic of a conventional wet bench tank having a full-lid panel.
Figure 4:
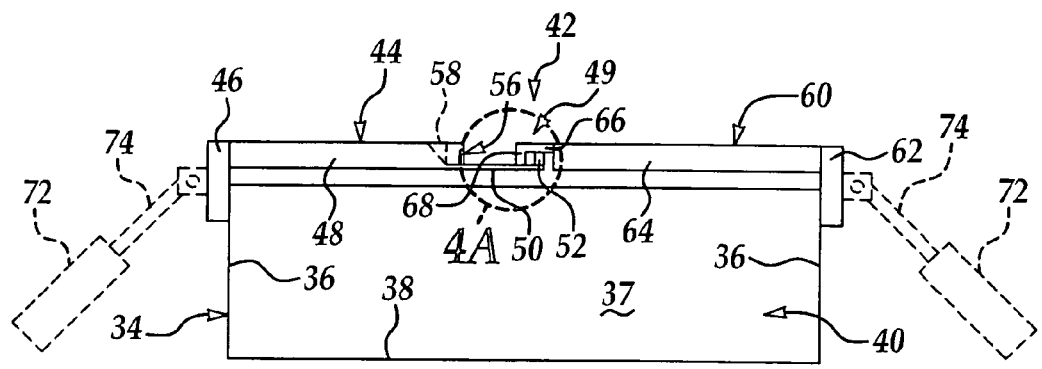
FIG. 4 is a front end view of a wet bench tank fitted with an interlocking lid of the present invention, with the interlocking lid shown in the closed position.

Referring initially to FIGS. 4–8, a wet bench tank 32 which is provided with an interlocking lid 42 according to the present invention, is shown in FIG. 4. The wet bench tank 32 includes a typically elongated, rectangular tank body 34, which is shown in front end view in FIG. 4. The tank body 34 typically includes a pair of side walls 36 and a pair of spaced-apart end walls 37 (one of which is shown). The side walls 36, end walls 37 and a tank bottom 38 define a tank interior 40, within which semiconductor wafers (not shown) are subjected to photoresist stripping or other semiconductor processing.

Briefly, the interlocking lid 42 of the present invention includes a base lid panel 44 and a cover lid panel 60 which are hingedly connected to the tank body 34, as hereinafter further described. The base lid panel 44 and cover lid panel 60 are together provided with a lid clasp 49 by which the base lid panel 44 and cover lid panel 60 sealingly engage each other when in the closed position. Accordingly, the closed and sealed interlocking lid 42 prevents the inadvertent entry of potential contaminating liquids or other foreign substances into the tank interior 40 during or prior to processing of wafers therein, as hereinafter further described. The base lid panel 44 and cover lid panel 60 of the interlocking lid 42 may be polytetrafluoroethylene (TEFLON) or other inert material.

Figure 5:
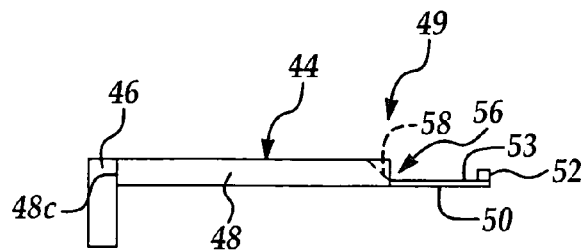
FIG. 5 is a transverse cross-section of a base lid panel element of the interlocking lid of the present invention, taken along section line 5—5 in FIG. 7.
Figure 7:
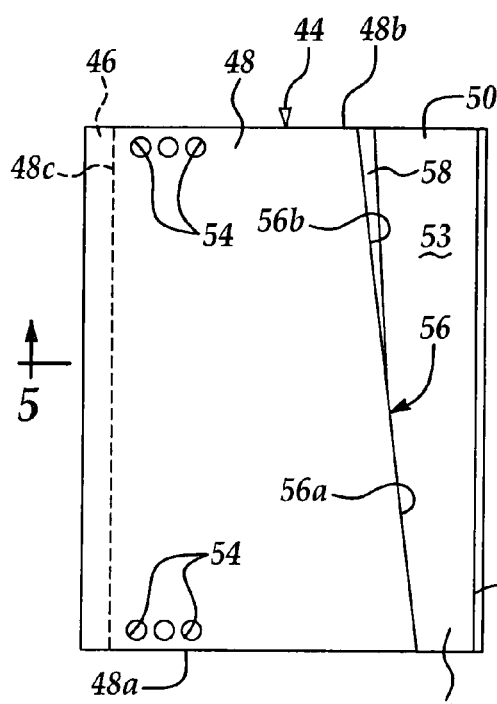
FIG. 7 is a top view of a base lid panel element of the interlocking lid of the present invention.

The base lid panel 44 of the interlocking lid 42 is shown in FIGS. 5 and 7 and includes a generally elongated, rectangular panel body 48. As shown in FIG. 7, the panel body 48 includes a front edge 48a and a rear edge 48b. An elongated panel hinge 46 is attached to the exterior longitudinal edge 48c of the panel body 48 for hingedly attaching the panel body 48 to one of the longitudinal side walls 36 or other element of the tank body 34, typically as shown in FIG. 4 and according to the knowledge of those skilled in the art. An elongated panel extension 50 extends from the opposite, interior longitudinal edge (which is defined by a beveled lid shoulder 56, hereinafter described) of the panel body 48. An elongated interlock flange 52 protrudes upwardly from and extends along the extending longitudinal edge of the panel extension 50.

A beveled lid shoulder 56 is provided in the panel body 48 and extends from the front edge 48a to the rear edge 48b of the panel body 48. As shown in FIG. 7, the beveled lid shoulder 56 typically defines the interior longitudinal edge of the panel body 48, which is opposite the exterior longitudinal edge 48c to which the panel hinge 46 is attached. Accordingly, as shown in FIG. 5, the panel extension 50 extends between the beveled lid shoulder 56 and the interlock flange 52. An interlock groove 53 of the lid clasp 49 is defined by the beveled lid shoulder 56, the panel extension 50 and the interlock flange 52.

As further shown in FIG. 7, the beveled lid shoulder 56 angles away from the interlock flange 52 from the front edge 48a to the rear edge 48b of the panel body 48. The beveled lid shoulder 56 includes a front segment 56a, which extends rearwardly from the front edge 48a of the panel body 48; and a rear segment 56b, which extends rearwardly from the front segment 56a to the rear edge 48b of the panel body 48.

A shoulder slope 58 may be shaped typically in the rear segment 56b of the beveled lid shoulder 56, and terminates at the rear edge 48b of the panel body 48. Alternatively, the shoulder slope 58 may be provided in both the front segment 56a and rear segment 56b, in which case the shoulder slope 58 may extend along a portion or the entire length of the beveled lid shoulder 56. One or multiple vent openings 54 may extend through the panel body 48, typically adjacent to the front edge 48a and rear edge 48b, respectively, to vent gas pressures from the tank interior 40 of the wet bench tank 32.

Figure 6:
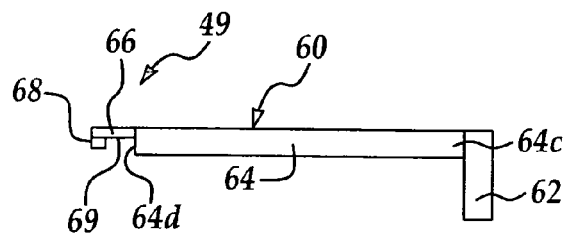
FIG. 6 is a transverse cross-section of a cover lid panel element of the interlocking lid of the present invention, taken along section line 6—6 in FIG. 8.
Figure 8:
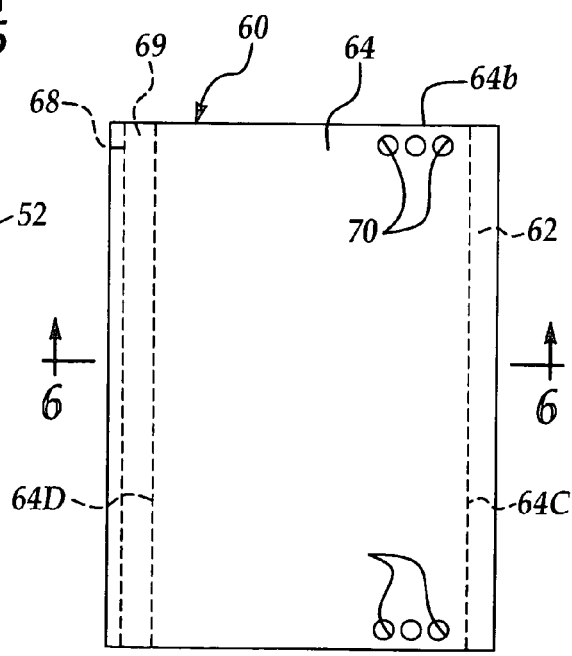
FIG. 8 is a top view of a cover lid panel element of the interlocking lid.

The cover lid panel 60 of the interlocking lid 42 is shown in FIGS. 6 and 8 and includes a generally elongated, rectangular panel body 64. As shown in FIG. 8, the panel body 64 includes a front edge 64a, a rear edge 64b, an exterior longitudinal edge 64c and an interior longitudinal edge 64d. An elongated panel hinge 62 is attached to the exterior longitudinal edge 64c of the panel body 64 for hingedly attaching the panel body 64 to a longitudinal side wall 36 or other element of the tank body 34, typically as shown in FIG. 4 and according to the knowledge of those skilled in the art. An elongated panel extension 66 extends from the opposite, interior longitudinal edge 64d of the panel body 64. An elongated interlock flange 68 protrudes downwardly from and extends along the extending longitudinal edge of the panel extension 66. Accordingly, an interlock groove 69 of the lid clasp 49 is defined by the interlock flange 68, the panel extension 66 and the interior longitudinal edge 64d of the panel body 64. One or multiple vent openings 70 may extend through the panel body 64, typically adjacent to the front edge 64a and rear edge 64b, respectively.

In wet bench tank applications, both the base lid panel 44 and the cover lid panel 60 may have a length of typically about 50 cm, a width of typically about 20 cm and a thickness of typically about 1.5~2 cm. However, it is understood that these dimension may vary among wet bench applications as well as among other applications of the interlocking lid 42.

As shown in FIG. 4, the panel hinge 46 of the base lid panel 44 and the panel hinge 62 of the cover lid panel 60 hingedly mount the base lid panel 44 and the cover lid panel 60 to opposite side walls 36, or to alternative elements, of the wet bench tank 32. A lid panel actuation piston 74, which is extendible from a pneumatic or hydraulic cylinder 72, may be operably connected to the base lid panel 44 and the cover lid panel 60, respectively, to actuate automatic opening and closing of the interlocking lid 42, as hereinafter described. Alternatively, it is understood that a motor (not shown) or any other suitable mechanism known by those skilled in the art may operably engage the base lid panel 44 and cover lid panel 60 for the automated opening and closing of the interlocking lid 42.

Figure 4A:
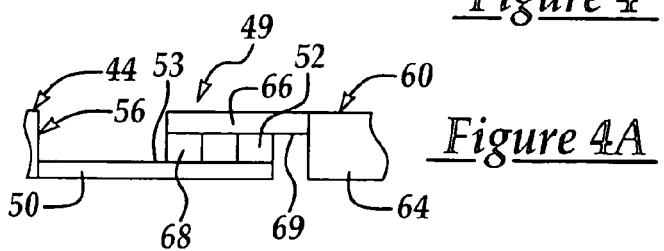
FIG. 4A is an enlarged sectional view, taken along section line 4A in FIG. 4.

Referring next to FIGS. 4 and 4A, wherein the interlocking lid 42 is shown in the closed position. Accordingly, the base lid panel 44 and the cover lid panel 60 are disposed in a generally horizontal position on the tank body 34, with the interlocking lid 42 sealing the tank interior 40. The lid clasp 49 seals the junction between the base lid panel 44 and the cover lid panel 60. As particularly shown in FIG. 4A, the panel extension 50 of the base lid panel 44 extends parallel to and beneath the panel extension 66 of the cover lid panel 60; the interlock flange 52 of the base lid panel 44 is seated in the interlock groove 69 of the cover lid panel 60; and the interlock flange 68 of the cover lid panel 60 is seated in the interlock groove 53 of the base lid panel 44.

During a PRS (photoresist stripping) or other semiconductor processing operation, liquids (not shown) may inadvertently drip from a wafer transfer robot (not shown), for example, onto the exterior surfaces of the base lid panel 44 and/or cover lid panel 60. Some of these liquids may otherwise react with a processing liquid (not shown) contained in the tank interior 40 of the tank body 34 to form by-products which are corrosive or damaging to metal layers formed on wafers to be processed in the tank interior 40, if not prevented from entering the tank interior 40. Accordingly, the lid clasp 49 of the interlocking lid 42 seals the junction between the base lid panel 44 and cover lid panel 60 and prevents liquids and other contaminants from inadvertently falling into the tank interior 40, between the base lid panel 44 and the cover lid panel 60.

Figure 9:
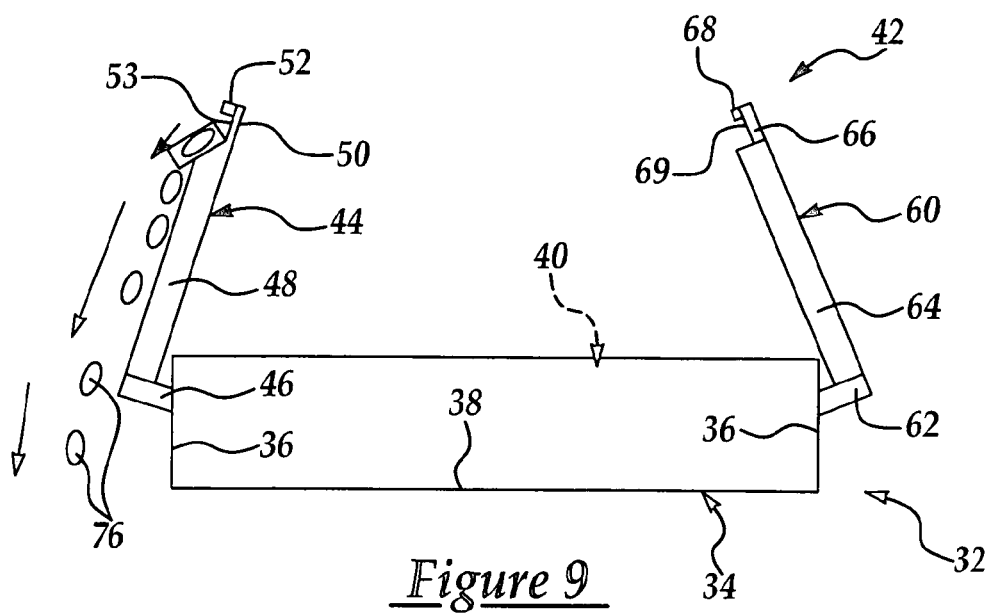
FIG. 9 is a front end view of a wet bench tank fitted with the interlocking lid of the present invention, illustrating opening of the interlocking lid and runoff of liquid from the exterior surface of the base lid panel.
Figure 10:
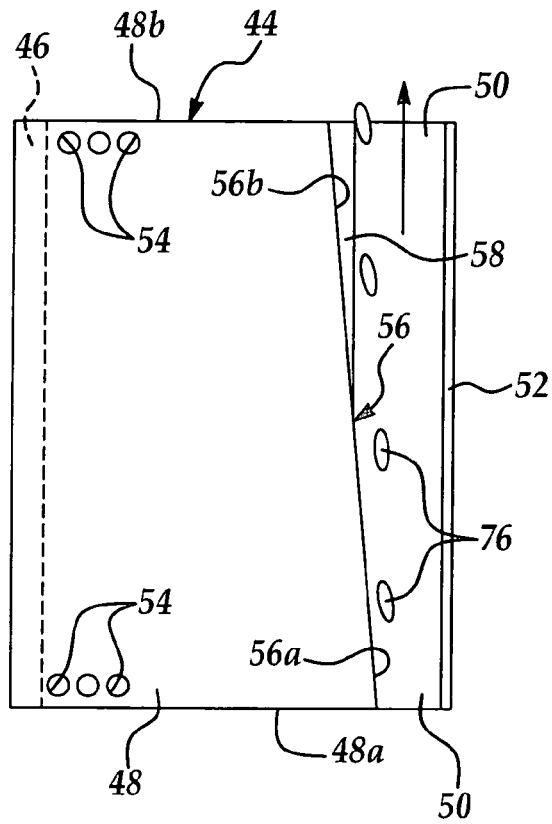
FIG. 10 is an exterior view of the base lid panel, illustrating runoff of liquid from the exterior surface of the base lid panel upon opening of the interlocking lid.

Referring next to FIG. 9, wherein the interlocking lid 42 is shown in the open position, and FIG. 10, wherein a top view of the base lid panel 44 in the open position is shown. In the side view of FIG. 9 and the top view of FIG. 10, a liquid 76, such as a residual aqueous acid solution, for example, has previously inadvertently dripped from a wafer transfer robot (not shown), for example, onto the exterior surface of the base lid panel 44, the cover lid panel 60, or both, when the interlocking lid 42 was in the closed position of FIG. 4. As the interlocking lid 42 is opened, typically by actuation of the cylinders 72 (FIG. 4) or other mechanism, the base lid panel 44 and cover lid panel 60 are gradually opened from the horizontal, closed position of FIG. 4 to the sloped position of FIG. 9. Accordingly, the liquid 76 rolls off the upper surface of the base lid panel 44 and/or cover lid panel 60 without entering the tank interior 40 between the base lid panel 44 and cover lid panel 60.

As shown in FIG. 10, as the interlocking lid 42 is opened from the closed position to the open position, the beveled lid shoulder 56 gradually assumes a downwardly-sloped configuration from the front edge 48a to the rear edge 48b of the panel body 48 of the base lid panel 44. In the event that liquid 76 inadvertently falls onto the exterior surface of the base lid panel 44, particularly onto the exterior or upper surface of the panel extension 50, the beveled lid shoulder 56 defines a downwardly-sloped liquid runoff surface along which the liquid 76 flows from the base lid panel 44. The shoulder slope 58 provided in the beveled lid shoulder 56 further facilitates runoff of the liquid 76 from the base lid panel 44, as shown in FIG. 9. Consequently, the liquid 76 is substantially incapable of flowing from the panel extension 50 and into the tank interior 40, between the base lid panel 44 and the cover lid panel 60, upon opening of the interlocking lid 42.

In the embodiment of the interlocking lid 42 described herein above and shown with respect to FIGS. 4–9, the beveled lid shoulder 56, alone or in combination with the shoulder slope 58, is provided in the base lid panel 44 rather than in the cover lid panel 60. However, it is understood that the beveled lid shoulder 56, alone or in combination with the shoulder slope 58, may be provided in the base lid panel 44 alone, the cover lid panel 60 alone, or in both the base lid panel 44 and the cover lid panel 60.

While the preferred embodiments of the invention have been described above, it will be recognized and understood that various modifications can be made in the invention and the appended claims are intended to cover all such modifications which may fall within the spirit and scope of the invention.

What is claimed is:

1. An interlocking lid for a container for receiving and processing a plurality of substrates, comprising:
   first and second lid panels for hingedly engaging the container adjacent to each other, said first and second lid panels positional between closed and opened positions; and
   wherein at least one of said first and second lid panels comprises a beveled lid shoulder comprising a downwardly-sloped liquid runoff surface for facilitating liquid runoff along a length of said beveled lid shoulder, an interlock flange spaced-apart from said beveled lid shoulder and an interlock groove between said interlock flange and said beveled lid shoulder.

2. The interlocking lid of claim 1 wherein said interlock flange is carried by said first and second lid panels for sealing said first and second lid panels in said closed position.

3. The interlocking lid of claim 1 further comprising a pair of cylinders and a panel actuation piston extendible from each of said cylinders-and operably engaging a corresponding one of said first and second lid panels for positioning said first and second lid panels between said closed position and said open position.

4. The interlocking lid of claim 3 wherein said interlock flange is carried by said first and second lid panels for sealing said first and second lid panels in said closed position.

5. The interlocking lid of claim 1 further comprising a shoulder slope shaped in said beveled lid shoulder for facilitating said liquid runoff when said first and second lid panels are positioned from said closed position to said open position.

6. The interlocking lid of claim 5 wherein said interlock flange is carried by said first and second lid panels for sealing said first and second lid panels in said closed position.

7. The interlocking lid of claim 5 further comprising a pair of cylinders and a lid panel actuation piston extendible from each of said cylinders-and operably engaging a corresponding one of said first and second lid panels for positioning said first and second lid panels between said closed position and said open position.

8. The interlocking lid of claim 7 wherein said interlock flange is carried by said first and second lid panels for sealing said first and second lid panels in said closed position.

9. An interlocking lid for a wet bench tank container for receiving and processing a plurality of substrates, comprising:
   first and second lid panels for hingedly engaging the container adjacent to each other, said first and second lid panels positional between closed and opened positions;
   wherein at least one of said first and second lid panels comprises a beveled lid shoulder comprising a downwardly-sloped liquid runoff surface having a front segment and a rear segment, an interlock flange spaced-apart from said beveled lid shoulder and an interlock groove between said interlock flange and said beveled lid shoulder for facilitating liquid runoff along a length of said beveled lid shoulder; and
   a shoulder slope provided in said rear segment of said beveled lid shoulder to facilitate said liquid runoff perpendicular to a length said beveled lid shoulder when said first and second lid panels are positioned from said closed position to said open position.

10. The interlocking lid of claim 9 wherein said interlock flange is carried by said first and second lid panels for sealing said first and second lid panels in said closed position.

11. The interlocking lid of claim 9 further comprising a pair of cylinders and a lid panel actuation piston extendible from each of said cylinders-and operably engaging a corresponding one of said first and second lid panels for positioning said first and second lid panels between said closed position and said open position.

12. The interlocking lid of claim 11 further comprising a lid clasp carried by said first and second lid panels for sealing said first and second lid panels in said closed position.

13. An interlocking lid for a wet bench tank container for receiving and processing a plurality of substrates, comprising:
   first and second lid panels for hingedly engaging the container adjacent to each other, said first and second lid panels positional between closed and opened positions;
   wherein at least one of said first and second lid panels comprises a beveled lid shoulder comprising a downwardly-sloped liquid runoff surface, an interlock flange spaced-apart from said beveled lid shoulder and an interlock groove between said interlock flange and said beveled lid shoulder for facilitating liquid runoff, said downwardly-sloped liquid runoff surface for facilitating said liquid runoff along a length of said beveled lid surface; and said interlock flange comprising a first interlock flange carried by said first lid panel for removably engaging said second lid panel and a second interlock flange carried by said second lid panel for removably engaging said first lid panel;

wherein said beveled lid shoulder further comprises a shoulder slope provided in said rear segment of said beveled lid shoulder to facilitate said liquid runoff perpendicular to a length said beveled lid shoulder when said first and second lid panels are positioned from said closed position to said open position.

14. The interlocking lid of claim 13 further comprising a pair of cylinders and a lid panel actuation piston extendible from each of said cylinders and operably engaging a corresponding one of said first and second lid panels for positioning said first and second lid panels between said closed position and said open position.

15. The interlocking lid of claim 13 wherein said interlock groove comprises a first interlock groove provided in said first lid panel for receiving said second interlock flange and further comprising a second interlock groove provided in said second lid panel for receiving said first interlock flange.

16. The interlocking lid of claim 15 further comprising a pair of cylinders and a lid panel actuation piston extendible from each of said cylinders-and operably engaging a corresponding one of said first and second lid panels for positioning said first and second lid panels between said closed position and said open position.

* * * * *